United States Patent [19]

Cook

[11] Patent Number: 4,730,238
[45] Date of Patent: Mar. 8, 1988

[54] DOUBLE SIDED MOUNTING MODULE FOR SURFACE MOUNT INTEGRATED CIRCUITS

[75] Inventor: Carl R. Cook, Coral Springs, Fla.
[73] Assignee: Gould Inc., Rolling Meadows, Ill.
[21] Appl. No.: 914,094
[22] Filed: Oct. 1, 1986
[51] Int. Cl.[4] ............................................. H05K 1/11
[52] U.S. Cl. .................................. 361/414; 361/392; 361/395; 361/417
[58] Field of Search .................................. 339/17 LC; 361/392–395, 410, 412–414, 417–420

[56] References Cited

U.S. PATENT DOCUMENTS

| 3,761,858 | 9/1973 | Oka | 361/393 |
| 3,958,155 | 5/1976 | Bogholtz et al. | 361/410 |
| 4,434,321 | 2/1984 | Betts | 361/414 |

FOREIGN PATENT DOCUMENTS 30984  3/1966  German Democratic Rep. ........................ 361/412

Primary Examiner—A. D. Pellinen
Assistant Examiner—Gregory P. Thompson
Attorney, Agent, or Firm—G. Paul Edgell; Robert J. Fox; Edward E. Sachs

[57] ABSTRACT

A multiple layer connection system for compactly connecting a plurality of surface mount integrated circuit packages to a printed circuit board is disclosed. A plurality of staggered metal legs is respectively inserted into a plurality of slots formed along an edge of an intermediate plastic sheet. A first outside sheet and a second outside sheet sandwich the intermediate sheet between themselves. The first outside sheet has a plurality of foil conductors formed on an inside layer thereof to connect with a first portion of the staggered legs. A plurality of feed through holes are in electrical connection with the first conductive traces and with a plurality of first outside foil traces which are connectable by soldering to the legs of a surface mount integrated circuit package. A second plurality of inside foil traces is formed on an inside layer of the second plastic sheet and contacts a second group of the legs. A second plurality of feed through holes connects the second plurality of inside foil to a second plurality of outside foil traces formed on an outside layer of the second sheet. A second integrated circuit surface mount device is connectable by soldering to the second plurality of outside conductive traces.

2 Claims, 9 Drawing Figures

DOUBLE SIDED MOUNTING MODULE FOR SURFACE MOUNT INTEGRATED CIRCUITS

BACKGROUND OF THE INVENTION

The invention relates generally to a mounting device for electrically connecting integrated circuits to printed circuit boards. More particularly the invention relates to a double sided multi-layer mounting module for electrically connecting a plurality of surface mount integrated circuits to a printed circuit board.

It is well known in the art to mount integrated circuit packages in electrical connection with one side of a printed circuit board. Typically, the integrated circuit packages are positioned in parallel with the plane of the printed circuit board and hence occupy a relatively large amount of space on the board. As electronic devices become more complex and devices such as mainframe computers and minicomputers employ more integrated circuits, it is desirable, if possible, to avoid increasing the size of the cabinets which hold the electronic systems comprising the computers.

One method of solving this problem has been to employ a system and module for mounting integrated circuit packages in electrical connection with opposite sides of a sheet-like rectangular insulating structure. Typically the structure is comprised of one or more stacked sheets of insulating material, such as polyimide and the like. Electrical connection from the legs of the surface mount integrated circuit packages to the conductive traces on the printed circuit board is effected through electrical connectors mounted on the surfaces of the module which contact the legs of the surface mount integrated circuit packages. The electrical connectors terminate in pads to which are bonded by simultaneous soldering a plurality of legs comprised of a lead frame which extends from the outside surface downward from the module. The legs are adapted to be placed in conductive engagement with a plurality of plated through holes in a printed circuit board having connected thereto the printed circuit board conductive traces.

It may be appreciated, however, that this system, while saving some space, is not as space efficient as it might be. The fact that the lead frame conductors must be attached to the conductive traces on the outside of the modules causes a portion of the module faces to be consumed by such lead frames which cannot be used by surface mount integrated circuit packages. This causes the modules to have a height which extends at least as far above the printed circuit board as the length of the lead frame leads and the width of the surface mount devices attached to the module.

What is needed is a more compact module for connecting a plurality of integrated circuits in substantially perpendicular orientation to a conventional printed circuit board.

SUMMARY OF THE INVENTION

A multiple layer module for mounting a plurality of surface mount integrated circuits thereon and for electrical connection with a conventional printed circuit board includes a plurality of conductive legs. The legs extend into a plurality of guide slots formed along an edge of an intermediate layer comprised of polyimide or the like. A first polyimide outer layer having a plurality of connecting pads formed thereon is adhesively secured to one side of the intermediate layer. The connecting pads of the first outer layer are in registration and conducting contact with certain ones of the metal legs. A plurality of conductive foil traces runs from the connecting pads to a plurality of plated through holes extending from the inner surface of the first layer to an outer surface thereof. A first plurality of outside conductive foil traces connects the plated through holes, on the outer surface, to a plurality of contact pads which are adapted to be electrically connected to the legs of a surface mount device.

Likewise, a second outer layer is positioned against the insulating layer opposite the first outer layer, so that the insulating layer is sandwiched between the outer layers. The second outer layer has a second inside face having a plurality of contact pads formed thereon. The second plurality of contact pads are aligned in contacting registry with the others of the metal legs. A second plurality of foil conductors is connected to the contact pads and to a second plurality of plated through holes extending through the second layer. A second plurality of outer foil conductors extends from respective ones of the plated through holes to a plurality of contact pads formed on the surface thereof which are adapted to be electrically connected to the legs of a surface mount integrated circuit.

It is a principal object of the present invention to provide a double sided surface mounting module for surface mount integrated circuit devices which extends a minimal distance from a printed circuit board to which it is mounted.

It is another object of the present invention to provide a double sided surface mounting module for surface mount integrated circuits wherein a plurality of connecting legs are connected internally of the module and not to occupy or connect to surface portions of the module adjacent surface mount integrated circuits.

It is a still further object of the instant invention to provide a compact double sided mounting device for surface mount integrated circuits which may be easily and economically manufactured.

Other objects and uses of the present invention will become obvious to one skilled in the art upon a perusal of the following specifications and claims in light of the accompanying drawings.

DESCRIPTION OF THE PREFERRED EMBODIMENT

Figure 1:
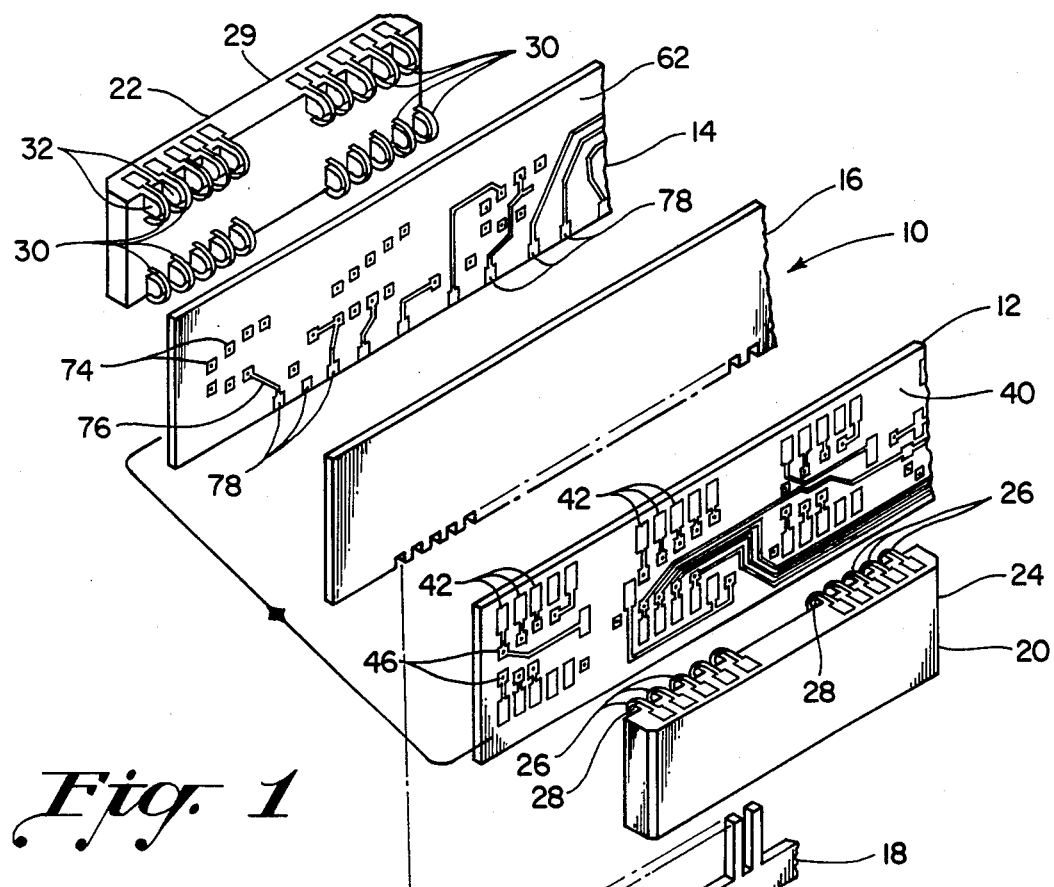
FIG. 1 is an exploded perspective view, with portions broken away, of a double sided surface mount module having three layers and shown in mounting relation to a pair of surface mount integrated circuits adapted to be connected to opposite sides thereof.

Referring now to the drawings and especially to FIG. 1, a double sided surface mounting module embodying the present invention is generally identified therein by numeral 10. The surface mounting module 10 is shown in exploded perspective or unassembled view in FIG. 1 and includes a first outside or front layer 12, a second outside or back layer 14 and an intermediate layer 16. A plurality of conductive legs comprising a portion of a lead frame 18 is insertable into layer 16, as will be discussed in more detail hereafter. A first surface mount integrated circuit package 20 is adapted to be solder connected to the outer layer 12, a second surface mount integrated circuit package 22 is adapted to be solder connected to the outer layer 14.

Figure 2:
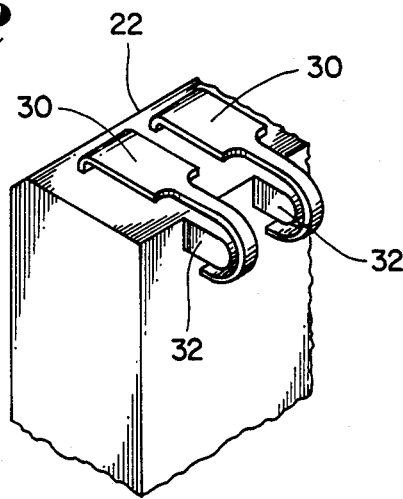
FIG. 2 is a perspective view of an enlarged portion of a surface mount integrated circuit package of the type shown in FIG. 1, showing details of the connecting legs and supporting structures thereunder.
Figure 3:
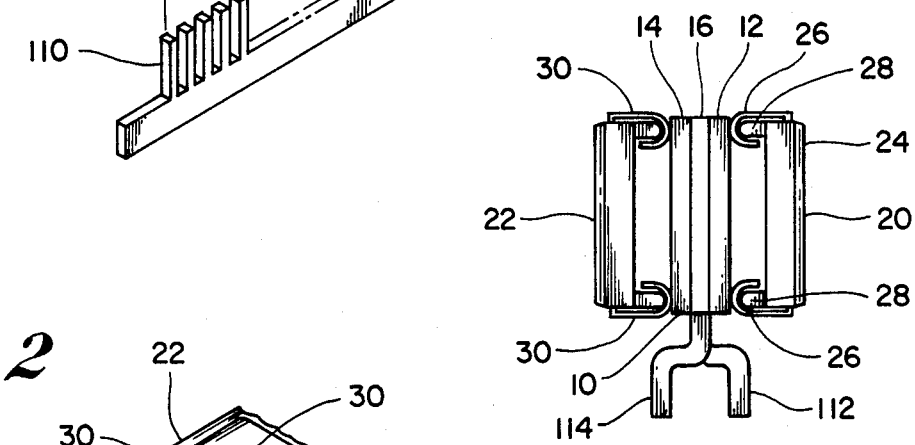
FIG. 3 is an end elevational view of the double sided surface mounted device of FIG. 1 showing details of the mounting placement of a pair of integrated circuit packages and the displacement of certain metal connecting legs from the central line of the package.

The surface mount integrated circuit packages 20 and 22 are conventional SOJ packages. The integrated circuit packages 20, as may be seen in FIGS. 1, 2 and 3, comprises a plastic housing 24 with a plurality of conductive legs 26 extending in a curved fashion therefrom. Each of the curved conductive legs 26 has an integral extending support 28 in contact with it to prevent the legs from being distorted by pressure placed upon the package 20. The integral support 28 is formed integral with the plastic package 24.

Similarly, the integrated circuit 22 is identical to the integrated circuit 20 in that a plurality of legs 30 extend from a plastic integrated circuit package 29. In the embodiment disclosed, each of the integrated circuit packages 20 and 22 has twenty connecting legs, although different numbers of legs may be used as well and would be apparent to one skilled in the art. The legs 30 are supported by integral supports 32 formed integral with the plastic package 29.

Figure 4:
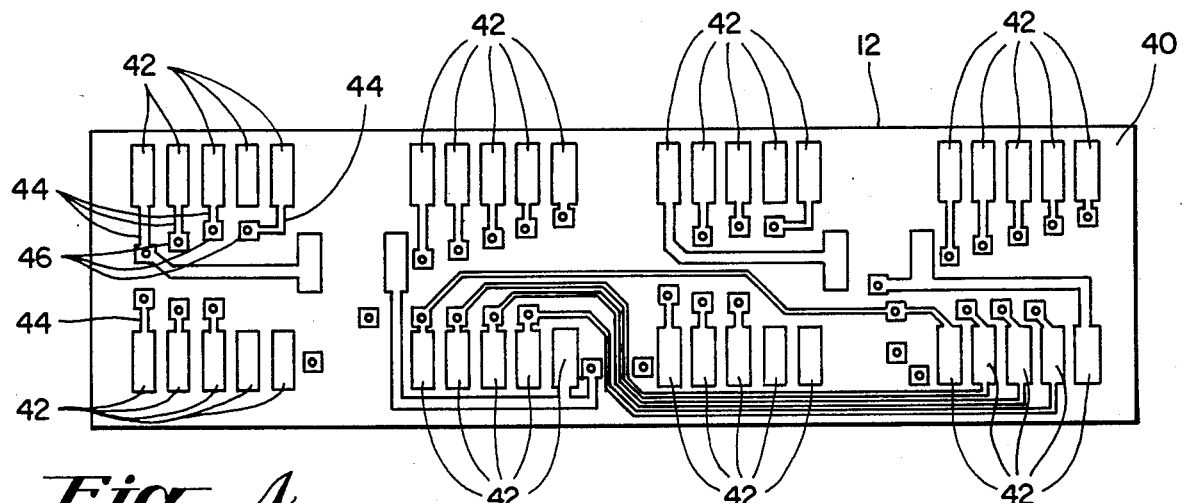
FIG. 4 is an elevational view of the front surface of a layer of the double sided module of FIG. 1.
Figure 5:
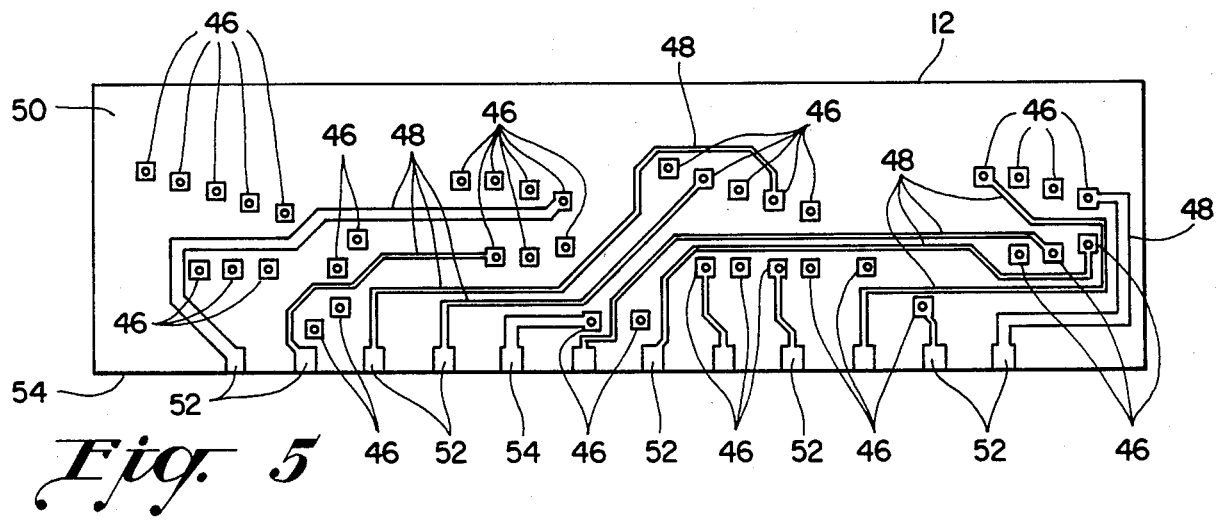
FIG. 5 is an elevational view of the rear or hidden side of the layer of the double sided module of FIG. 4.

Referring now to FIG. 4, which is an elevational view of an outer surface 40 of intermediate layer 12, a plurality of contact or conducting pads 42 are formed thereon using a conventional printed circuit process. Each of the pads 42 has connected thereto a respective conductive trace or foil 44. As may best be seen in FIG. 5, the conductive traces 44 are connected to rectangular plated through holes 46 which extend through the layer 12 from the outer surface 40 to an inside surface 50. Certain ones of the plated through holes 46 are connected via a plurality of conductive traces or foils 48 to a plurality of contact pads 52, individual members of which are formed in spaced relationship along a bottom edge 54 of the inside surface 50. Thus, the pads 42 are connected via the foil traces 44 through the plated through holes 46 to the conductive traces 48 and thence to the pads 52. The legs 26 of the integrated circuit package 20 may be soldered to the pads 42 in a conventional fashion using vapor phase soldering or the like.

Figure 7:
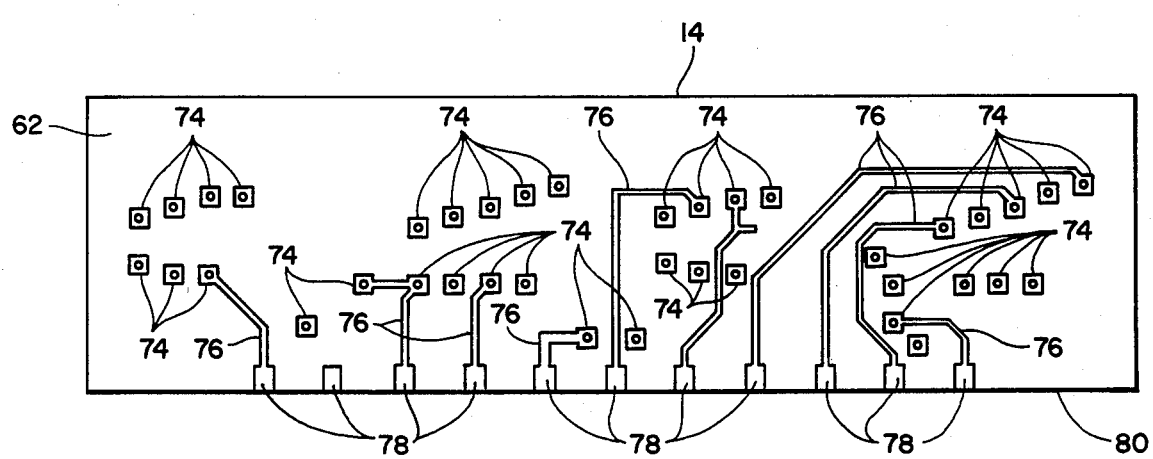
FIG. 7 is an elevational view of the inside surface of the outer layer in FIG. 1.
Figure 8:
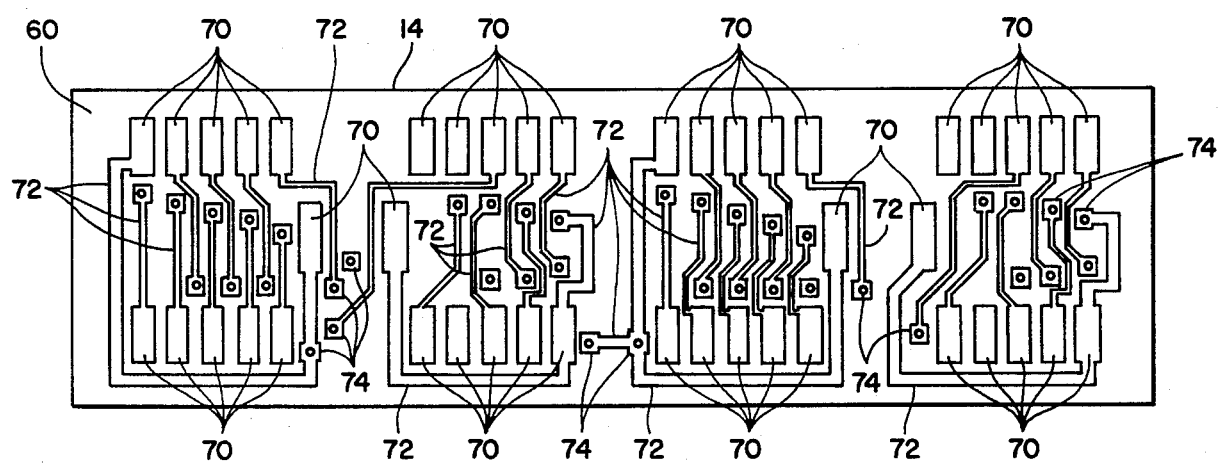
FIG. 8 is an elevational view of the outside of the outer layer in FIG. 1.

In a similar fashion as may best be seen in FIGS. 7 and 8, the outer layer 14 has an outside surface 60 and an inside surface 62. The outer surface 60 of the layer 14 has a plurality of foil contact pads 70 formed thereon. A plurality of foil conductors 72 is connected to the pads 70 for good electrical conduction therewith. The foil conductors 72 are connected to respective ones of a plurality of plated through holes 74 which extend from the outer surface 60 to the inner surface 62 to provide a conductive bridge therebetween.

Each of the plated through holes 74 opens onto inner surface 62 of the layer 14. The plated through holes 74 have connected to certain ones of them respective foil conductors 76 to which are connected a plurality of contact or connecting pads 78. The plurality of contact pads 78 are aligned along a bottom edge 80 of the inside surface 62.

Figure 6:
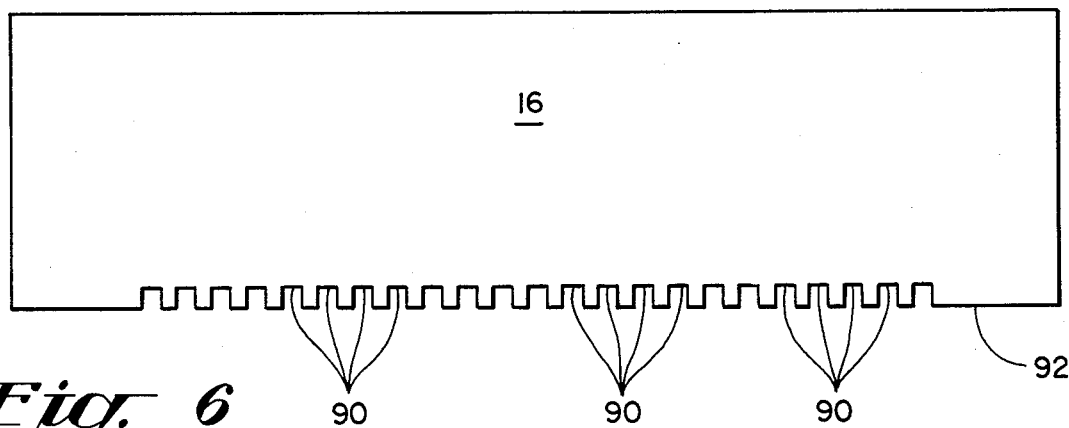
FIG. 6 is an elevational view of an exemplary side of the intermediate layer of FIG. 1.
Figure 9:
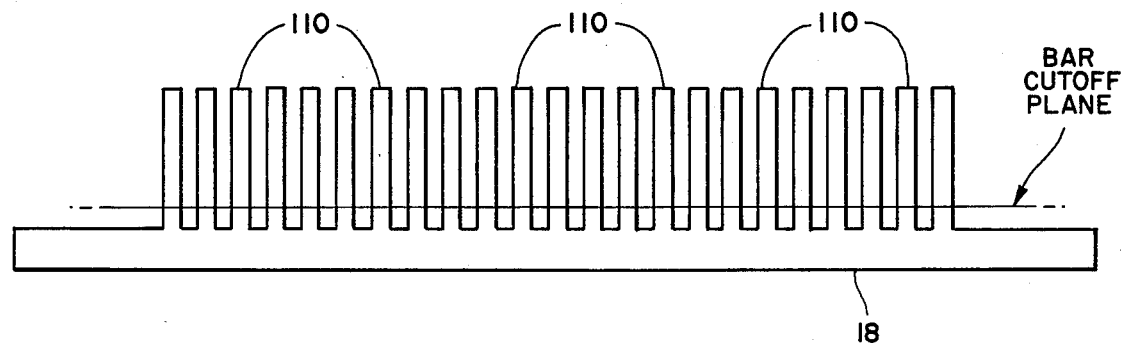
FIG. 9 is an elevational view of a lead frame showing details of the metal legs formed integral therewith and the line along which the lead frame is cut off from the legs after assembly with other portions of the double sided surface mounting module.

The instant double sided mounted module 10 may be assembled by inserting the intermediate rectangular layer 16 which has a plurality of slots 90 formed in a bottom edge 92 as may best be seen in FIG. 6. The intermediate layer 16 is coated with an epoxy adhesive which does not cover the connecting pads 52. Likewise the layer 14 is bonded to layer 16 with an epoxy adhesive which leaves the connecting pads 78 exposed. When the three layers 12, 14 and 16 are thus bonded together the bonding pads 52 and 78 are in registry with alternating ones of the slots 90 in the insulating layer 16. The lead frame 18, which has a plurality of rectangular legs 110 formed integral therewith as may best be seen in FIG. 9, is inserted between the layers 12 and 14 so that a portion of each of the legs 110 slides into a slot 90. The pads 52 and 78 are presoldered so that the lead frame 18 and plastic layer assembly may be heated causing the legs 110 to be solder connected to respective ones of the pads 52 and 78.

The legs 110 are then cut off from the lead frame 18 along the bar cutoff plane shown in FIG. 9. Since alternating legs 110 are connected respectively to the pads 52 and 78 the portions of legs 110 which are connected to the pads 52 are bent forward to define a plurality of legs 112 for electrical connection therewith. In a similar fashion the other or remaining legs 110 are bent backward to define a second plurality of legs 114.

Thus, what is disclosed and claimed is a very compact integrated circuit mounting module 10 which is adapted to receive a plurality of integrated circuits on the outer surface thereof and carries electrical signals the layers 12 and 14 to a plurality of connecting legs which are quickly and easily internally assembled with respective contact foils. The layers 12, 14 and 16 may be composed of polyimide, ceramic or other insulating materials. In the present embodiment the conductive foils are copper foil having a thickness of 0.002 inches. The foil patterns are formed by conventional printed circuit techniques as are the plated through holes.

The use of the internal connection to the legs 110 allows all of the outer surfaces 40 and 60 to be used for integrated circuit package real estate thereby conserving space on the printed circuit board to which the assembly 10 may be mounted via the legs 112 and 114 in a conventional fashion.

While there has been illustrated and described a particular embodiment of the present invention, it will be appreciated that numerous changes and modifications will occur to those skilled in the art, and it is intended in the appended claims to cover all those changes and modifications which fall within the true spirit and scope of the present invention.

What is claimed is:

1. A mounting module for electrically connecting a surface mount integrated circuit to a printed circuit board, comprising: an insulating body having a exposed first and second face, said insulating body having a first and second outer insulating layers and an intermediate insulating layer, said intermediate insulating layer having an edge portion defining a plurality of slots; a first plurality of exposed conductors mounted upon said first exposed face; a second plurality of exposed conductors mounted upon said second exposed face; a first plurality of feed-through holes electrically connected to said first plurality of exposed conductors and extending interiorly of said first exposed face; a second plurality of feed-through holes electrically connected to said second plurality of exposed conductors and extending interiorly of said second exposed face; a first plurality of connection pads mounted interiorly of said insulating body and being electrically connected to said first plurality of feed-through holes; a second plurality of connection pads mounted interiorly of said insulating body and being electrically connected to said second plurality of feed-through holes; and a plurality of conductive legs extending into respective ones of said plurality of slots in an interior portion of said insulating body, each said conductive leg of said plurality contacting a respective connection pad of said first and second pluralities in good electrical connection therewith.

2. A mounting module for electrically connecting a surface mount integrated circuit to a printed circuit board as defined in claim 1, wherein said slots of said intermediate insulating layer hold said legs of said plurality of conductive legs in alignment with said first plurality of connection pads and said second plurality of connection pads.

* * * * *